(12) United States Patent
Schmidt

(10) Patent No.: US 11,262,414 B2
(45) Date of Patent: Mar. 1, 2022

(54) DEVICE FOR DETECTING A DEFORMATION OF AN ELECTRICAL ENERGY STORE

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 16/824,918

(22) Filed: Mar. 20, 2020

(65) Prior Publication Data

US 2020/0217902 A1 Jul. 9, 2020

Related U.S. Application Data

(63) Continuation of application No. PCT/EP2018/078924, filed on Oct. 22, 2018.

(30) Foreign Application Priority Data

Nov. 13, 2017 (DE) ..................... 10 2017 220 134.7

(51) Int. Cl.
*G06F 13/00* (2006.01)
*G01R 31/392* (2019.01)
*G01R 31/36* (2020.01)

(52) U.S. Cl.
CPC ....... *G01R 31/392* (2019.01); *G01R 31/3646* (2019.01); *G01R 31/3648* (2013.01)

(58) Field of Classification Search
CPC ...................................................... G01R 31/392
See application file for complete search history.

(56) References Cited

U.S. PATENT DOCUMENTS

| | | | | |
|---|---|---|---|---|
| 6,037,777 A | * | 3/2000 | Champlin | ............ G01R 31/367 |
| | | | | 324/430 |
| 2012/0145564 A1 | | 6/2012 | Yamazaki et al. | |
| 2014/0049251 A1 | | 2/2014 | Peyton et al. | |
| 2014/0085094 A1 | * | 3/2014 | Schumann | .......... H01M 10/488 |
| | | | | 340/636.1 |
| 2014/0106184 A1 | | 4/2014 | Xie et al. | |
| 2015/0234012 A1 | | 8/2015 | Iwase | |

(Continued)

FOREIGN PATENT DOCUMENTS

| | | |
|---|---|---|
| CN | 1322298 A | 11/2001 |
| CN | 102356497 A | 2/2012 |
| CN | 102544551 A | 7/2012 |

(Continued)

OTHER PUBLICATIONS

International Search Report (PCT/ISA/210) issued in PCT Application No. PCT/EP2018/078924 dated Apr. 1, 2019 with English translation (four (4) pages).

(Continued)

*Primary Examiner* — Phuong Huynh
(74) *Attorney, Agent, or Firm* — Crowell & Moring LLP

(57) ABSTRACT

A device detects a deformation of an electrical energy store. The device has a measuring device which is designed to measure the electrical current/voltage behavior of the energy store, and an evaluation unit which is designed to detect a change in the current/voltage behavior and to determine the deformation on the basis of the change.

7 Claims, 4 Drawing Sheets

| | | V01:<br>Up to 50% of<br>the dimension | V02:<br>Stop before<br>short circuit | V03:<br>Stop before<br>short circuit |
|---|---|---|---|---|
| a) | Event | Slight short circuit | — | — |
| | ΔZ | High & irreversible | High & irreversible | High & irreversible |
| b) | Event | — | — | — |
| | ΔZ | Low & reversible | Low & reversible | Low & reversible |
| c) | Event | Short circuit | — | — |
| | ΔZ | Low & reversible | Low & reversible | Low & reversible |

(56) References Cited

U.S. PATENT DOCUMENTS

2015/0253204 A1   9/2015   Hebiguchi
2019/0056456 A1   2/2019   Fukuda et al.

FOREIGN PATENT DOCUMENTS

| CN | 103635798 A | 3/2014 |
| CN | 104538694 A | 4/2015 |
| CN | 104937387 A | 9/2015 |
| DE | 10 2012 217 037 A1 | 3/2014 |
| EP | 3 054 523 A1 | 8/2016 |
| EP | 3054523 | * 10/2016 |
| JP | 2017/168422 A | 9/2017 |
| WO | WO 2011/003797 A2 | 1/2011 |

OTHER PUBLICATIONS

German-language Written Opinion (PCT/ISA/237) issued in PCT Application No. PCT/EP2018/078924 dated Apr. 1, 2019 (six (6) pages).

German-language Search Report issued in German Application No. 102017220134.7 dated Sep. 27, 2018 with partial English translation (12 pages).

Chinese-language Office Action issued in Chinese Application No. 201880056996.4 dated Jul. 29, 2021 with English translation (23 pages).

* cited by examiner

|  |  | V01:<br>Up to 50% of<br>the dimension | V02:<br>Stop before<br>short circuit | V03:<br>Stop before<br>short circuit |
|---|---|---|---|---|
| a) | Event | Slight short circuit | — | — |
|  | ΔZ | High & irreversible | High & irreversible | High & irreversible |
| b) | Event | — | — | — |
|  | ΔZ | Low & reversible | Low & reversible | Low & reversible |
| c) | Event | Short circuit | — | — |
|  | ΔZ | Low & reversible | Low & reversible | Low & reversible |

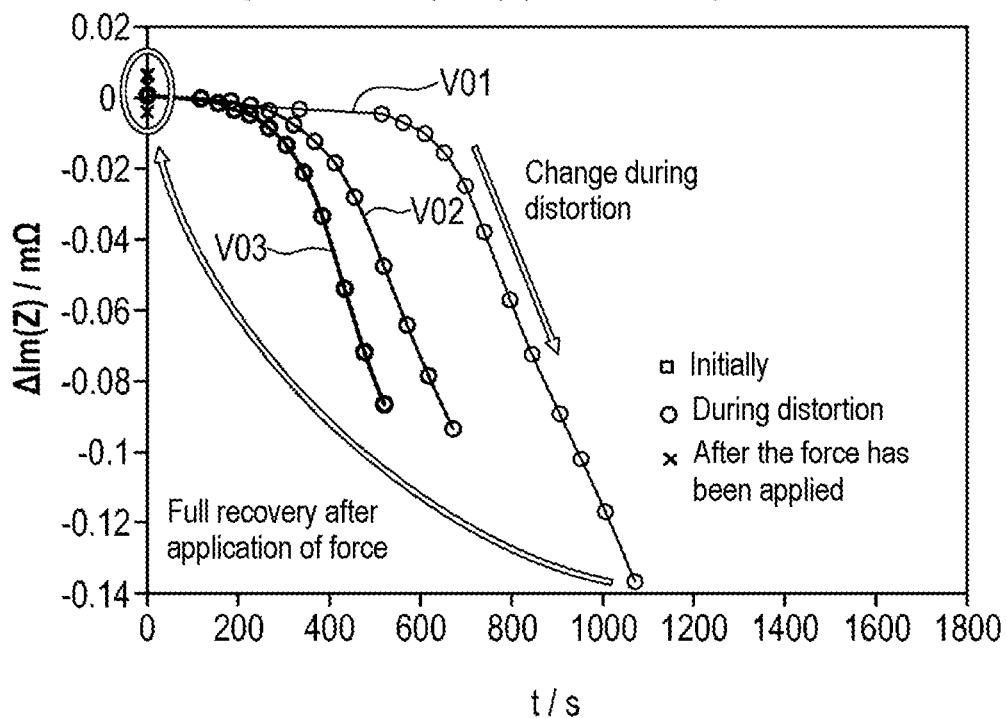
Fig. 3D
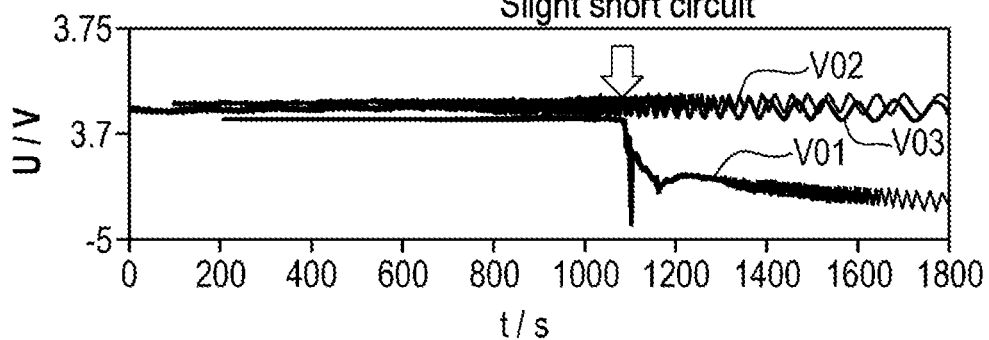
Fig. 4
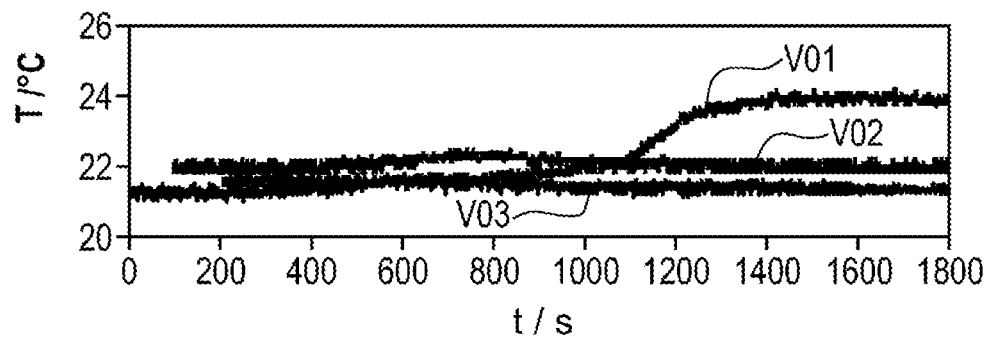

DEVICE FOR DETECTING A DEFORMATION OF AN ELECTRICAL ENERGY STORE

CROSS REFERENCE TO RELATED APPLICATIONS

This application is a continuation of PCT International Application No. PCT/EP2018/078924, filed Oct. 22, 2018, which claims priority under 35 U.S.C. § 119 from German Patent Application No. 10 2017 220 134.7, filed Nov. 13, 2017, the entire disclosures of which are herein expressly incorporated by reference.

BACKGROUND AND SUMMARY OF THE INVENTION

The invention concerns a device for detecting a deformation of an electrical energy storage device.

Accident or crash sensors are used in the prior art in motor vehicles with electric drive units—as well as in conventional vehicles with combustion engines. These sensors make it possible to detect an accident or a collision of the motor vehicle and to take appropriate measures. For example, once a collision has been detected, the motor vehicle can be prevented from continuing its journey. In particular, these measures protect against an energy storage device of the electrically powered motor vehicle deformed by the collision being put back into operation and creating an unsafe condition for the occupants.

A deformation of the energy storage device itself cannot be determined in the prior art. Accordingly, after a collision, the motor vehicle could be unnecessarily prevented from continuing its journey even though there is no deformation of the energy storage device.

Diametrically opposed to this, the energy storage device could be deformed in a collision, whereby the accident or crash sensor does not respond due to the characteristics of the collision, for example when the vehicle is stationary or slowly deforming. In this case, the motor vehicle could be put back into operation even though the energy storage device is too badly damaged. The consequences could be, for example, the burning through of individual energy storage cells of the energy storage device.

Bearing this in mind, it is the object of the invention to create a device which allows the detection of a deformation of an electrical energy storage device.

One aspect of the invention concerns a device for detecting a deformation of an electrical energy storage device, the device comprising: a measuring device arranged to measure an electrical current/voltage behavior of the energy storage device; and an evaluation unit which is arranged to detect a change in the current/voltage behavior and to determine the deformation based on the change.

The energy storage device, for example, is made up of a large number of individual energy storage cells, in which appropriate electrochemical components are accommodated. The preferred type of energy storage device is one that is used in a motor vehicle to supply an electric drive unit.

The measuring device can, for example, be realized by a separate sensor system. The evaluation unit can, for example, be implemented by software installed on a control unit.

For example, the measuring device can measure an electrical impedance or an electrical admittance of the energy storage device to determine the current/voltage behavior of the energy storage device. In this respect, the measuring device can determine a real and/or imaginary part of the impedance or admittance and evaluate the change in impedance or admittance with reference to the real and/or imaginary part.

Preferably, the device according to the invention has an arrangement, wherein the measuring device is arranged to determine a real part and an imaginary part of an electrical impedance or admittance of the energy storage device; and the evaluation unit is arranged to determine the change in impedance or admittance by comparing a change in the real part with a change in the imaginary part.

The comparison between the real part and the imaginary part is beneficial to the extent that other influencing variables on the impedance or admittance, such as the temperature of the energy storage device, can be taken into account and the deformation/distortion of the energy storage device can be detected more reliably.

According to the invention, the device preferably has an arrangement, wherein the evaluation unit determines the deformation if the comparison between the real part and the imaginary part shows that the change in the real part and the change in the imaginary part are not uniform with each other.

The temperature of the energy storage device, for example, has a uniform influence on the real part and imaginary part, whereas the deformation/distortion has influences on the real part and imaginary part that are not uniform. Ergo, in this arrangement, the evaluation unit determines the deformation if the changes in the imaginary part and the real part are not uniform.

Preferably, the device according to the invention may have an arrangement, wherein the evaluation unit determines the deformation when the change in impedance exceeds a certain threshold value.

The threshold value can be defined, for example, in relation to the real part and/or the imaginary part. If the extent of the change in the real part and the imaginary part depends on the direction from which a force acts on the energy storage device, the threshold value is preferably defined so that detection of the deformation or change is independent of the direction from which the force acts. In other words, the threshold value is defined in relation to the least sensitive direction.

Furthermore, the device according to the invention preferably has an arrangement, wherein the evaluation unit is arranged to receive or determine a temperature value indicating a temperature in an environment of the energy storage device and to relate the temperature value to the change in impedance or admittance.

This arrangement allows a consistency check as to whether a uniform change in the real part and imaginary part with a temperature change is plausible.

Furthermore, the device according to the invention may preferably have an arrangement, wherein the measuring device is arranged to measure the impedance or admittance of the electrical energy storage device by performing impedance/admittance spectroscopy on the energy storage device.

This arrangement is beneficial because it does not require any additional sensor system. Spectroscopy is performed by exciting the energy storage device via its connections with an AC voltage and determining the impedance or admittance from the reaction of the energy storage device. The avoidance of an additional sensor system leads to cost savings.

Furthermore, the device according to the invention preferably has an arrangement, wherein the evaluation unit is arranged to let the measuring device perform the impedance or admittance measurement and to detect the change in impedance or admittance when a trigger signal is received.

The trigger signal can, for example, be received by a collision sensor or a control unit of a motor vehicle.

Furthermore, the invention preferably concerns a motor vehicle comprising: a device as described above; and a collision sensor arranged to detect a collision of the motor vehicle with an obstacle; wherein the evaluation unit is arranged to have the impedance measuring device perform the impedance measurement and to detect the change in impedance when the trigger signal output by the collision sensor upon detection of the collision is received.

This arrangement of the invention protects occupants of the motor vehicle because the motor vehicle can preferably be designed in such a way that the energy storage device is disconnected when its deformation has been detected.

Other objects, advantages and novel features of the present invention will become apparent from the following detailed description of one or more preferred embodiments when considered in conjunction with the accompanying drawings.

BRIEF DESCRIPTION OF THE DRAWINGS

FIGS. 3C and 3D are diagrams showing curves of the progression over time of the imaginary part of the measured impedance of the energy storage cells corresponding to FIGS. 3A and 3B.

FIG. 4 shows the effects of the applied forces or deformations of the energy storage cells in relation to the electrical voltages of the energy storage cells as well as their temperature.

DETAILED DESCRIPTION OF THE DRAWINGS

Figures 1A, 1B:
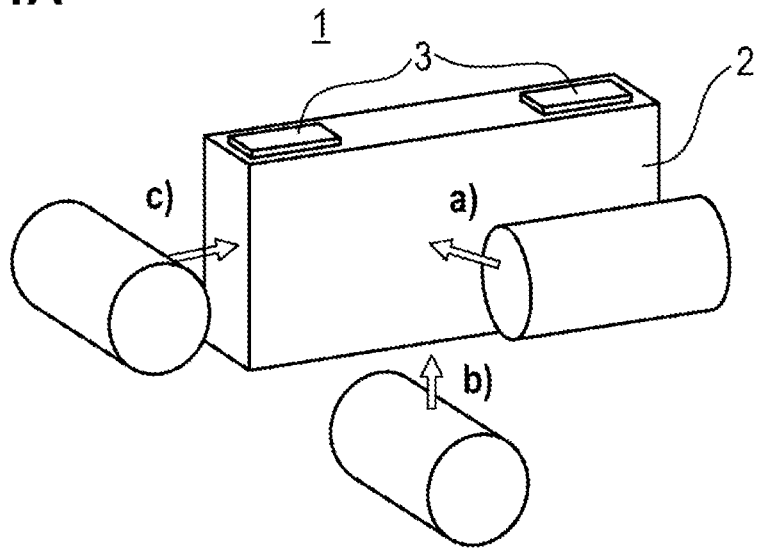
FIG. 1A shows an electrical energy storage device in the form of a single energy storage cell on which force can be applied from three different directions.
FIG. 1B is a table in which results (event and impedance change) of three test series are entered, where per test series, a certain force is applied to three identically constructed energy storage cells from one of the three directions shown in FIG. 1A.

FIG. 1A shows an electrical energy storage device. The electrical energy storage device is shown in FIG. 1A as a single energy storage cell 1. The energy storage cell 1 contains a housing 2, which preferably has a prismatic shape and in which electrochemical components of the energy storage cell 1 are accommodated. Electrical terminals 3 are arranged on an upper side of the housing 2. One of the electrical terminals 3 forms a negative terminal of the energy storage cell 1 and another one of the electrical terminals 3 forms a corresponding positive terminal of the energy storage cell 1.

The electrical energy storage device preferably contains a large number of such energy storage cells 1 shown in FIG. 1A, whereby the individual energy storage cells 1 of the energy storage device are connected to each other accordingly. The electrical energy storage device is preferably used to supply an electrical drive unit of a motor vehicle.

In the event of an accident or collision of the motor vehicle with an obstacle, the electrical energy storage device may be deformed or distorted. In this case, there is an unsafe condition of the electrical energy storage device, which is why the motor vehicle must be stopped and prevented from continuing its journey. In this case, for example, an electronic control system of the motor vehicle should separate the electrical energy storage device from the electrical drive unit of the motor vehicle.

Forces on the electrical energy storage device can act from different directions during the accident or collision and lead to distortion. FIG. 1A schematically shows forces applied to the energy storage cell 1 from three different directions:

The force in the direction a) shown is applied to a side surface of the energy storage cell 1, whereby the direction a) corresponds to the force applied in a thickness or depth direction of the prismatic housing 2.

By contrast, the force in the direction b) shown is applied to a bottom side of the housing 2, whereby the direction b) corresponds to the height direction of the energy storage cell 1.

Finally, the force is applied in the direction c) to a side surface of the housing 2, whereby the direction c) corresponds to a width direction of the housing 2.

Any force applied to the energy storage device as shown in FIG. 1A may cause deformation/distortion of the energy storage device or energy storage cell. This deformation/distortion is to be recognized.

In the course of the research activity that led to the present invention, it was recognized that the electrical energy storage device or electrical energy storage cell 1 changes its electrical characteristics (current/voltage behavior) when a deformation of the energy storage device or energy storage cell 1 occurs. In particular, it was recognized that the electrical impedance Z of the energy storage cell 1 changes in this process.

FIG. 1B shows a table in which three test series V01, V02 and V03 are entered. In each of the test series, three identically constructed electrical energy storage cells 1, as shown in FIG. 1A, were each subjected to a specific force application from one of the directions a)-c). The force was applied by tools indicated in FIG. 1A with cylinders.

The event occurring during the respective force application and the change in impedance (Z) of the electrical energy storage cell 1 are entered in the table in the respective column of the corresponding test series.

As shown in FIG. 1B, in the first test series V01, the specific force application was measured in such a way that the electrical energy storage cells 1 were each deformed or distorted by 50% of the corresponding dimension. This means:

A first energy storage cell 1 was dented or deformed by 50% of its thickness by the application of force in direction a). This led to the event that a slight short circuit occurred and the impedance of the electrical energy storage cell changed strongly and irreversibly.

In the same test series V01, a second, identically constructed energy storage cell was deformed by 50% of its height by the application of force from direction b). This did not lead to a short circuit and only to a slight, reversible change in the impedance of the corresponding energy storage cell.

Finally, in the test series V01, a third, identically constructed energy storage cell 1 was deformed by 50% of its width by the application of force from direction c). This led to a short circuit in the energy storage cell that only occurred for a short time (which healed again). The change in impedance was low and essentially reversible.

The findings from the test series V01 were used to determine the "specific force application" in the subsequent test series V02, V03. The test series V02 and V03 differ from the test series V01 in particular in the definition of the "specific force application" in that the energy storage cells were only deformed to such an extent that no short circuit of the energy storage cell occurred. This means that the tools deforming the energy storage cells were driven into the corresponding energy storage cell up to a position shortly before the occurrence of short circuits, based on the findings from the test series V01. This specification for the test series V02, V03 ensured that no destruction of the energy storage cell took place and the impedance could be measured after and during distortion. An applied force destroying the energy storage cell can be determined by evaluating the voltage of the energy storage cell; the impedance does not necessarily have to be determined for this purpose. The events corresponding to the test series V02, V03 and the changes in the impedance of the energy storage cells 1 are shown in the corresponding columns of the table in FIG. 1B for the respective directions of force application.

Figure 2:
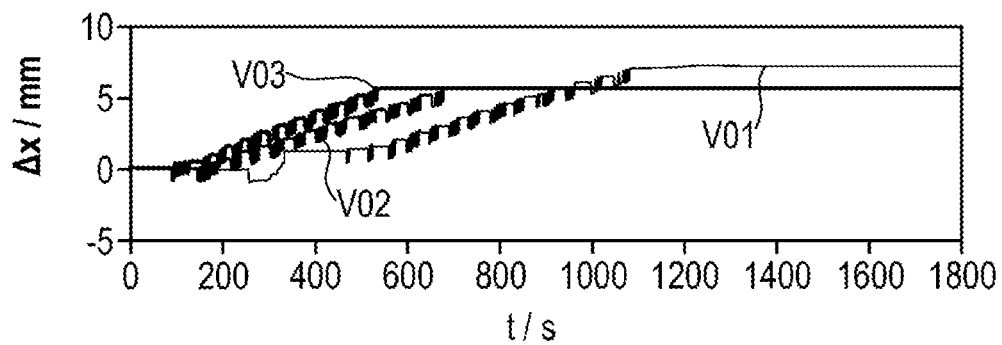
FIG. 2 is, on the one hand, a diagram showing a distortion of the respective energy storage cell for each of the test series mentioned with reference to FIG. 1B when force is applied in direction a), and, on the other hand, a corresponding diagram showing a respective curve of the force application.
Figure 2:
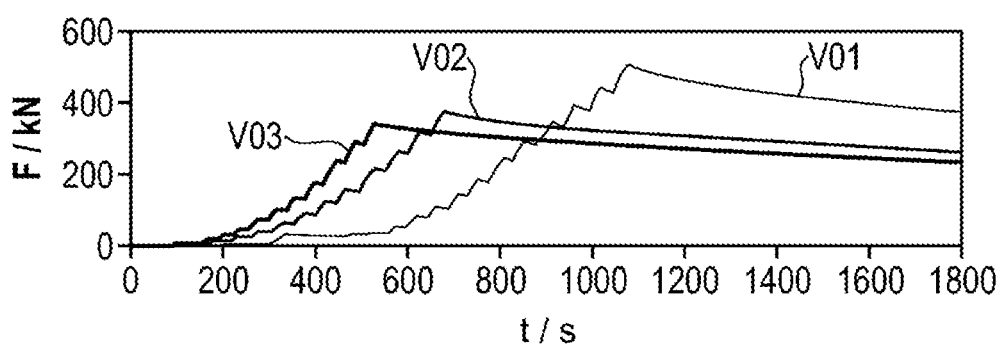

FIG. 2 shows two diagrams with three curves each.

The upper diagram shown in FIG. 2 shows over time (unit: seconds) the change in position (unit: millimeters) of the tool applying the pressure and thus the deformation of the corresponding energy storage cell 1. The three curves shown relate to all test series V01-V03, whereby the direction of the force application corresponds in each case to direction a).

The lower diagram shown in FIG. 2 relates to the application of force over time, whereby the three curves shown again correspond to the three test series V01-V03 for an application of force in direction a).

The test series V01-V03 were carried out very slowly—therefore unit of seconds in the diagrams—in order to obtain a large number of measuring points for the determination of the impedance and for a correlation of the positions/forces with the determined measured impedance values.

As can be seen in the lower diagram, the greatest force acts in the test series V01 and exceeds 400 kN (unit: kilonewton) at its maximum. The corresponding force curve also leads to the greatest deformation of the energy storage cell 1. The time until the maximum force was reached was about 1100 s in the test series V01 and led to a distortion of the energy storage cell by about 7 mm.

In the test series V02 and V03, a lower maximum force of just under 400 kN acts on the corresponding energy storage cells. As can be seen from the upper diagram in FIG. 2, both force applications led to approximately the same deformation of the energy storage cells.

During the performance of the test series, impedance spectroscopy was performed on the individual energy storage cells and the corresponding impedance of the respective energy storage cell 1 was measured thereby. The impedance spectroscopy was performed at a frequency of 5 kHz (kilohertz). Other frequency ranges are also possible, for example 1 kHz, 2 kHz, 3 kHz, 4 kHz or 6 kHz. Impedance spectroscopy provides both the real part and the imaginary part of the impedance of the energy storage cell.

Figure 3A:
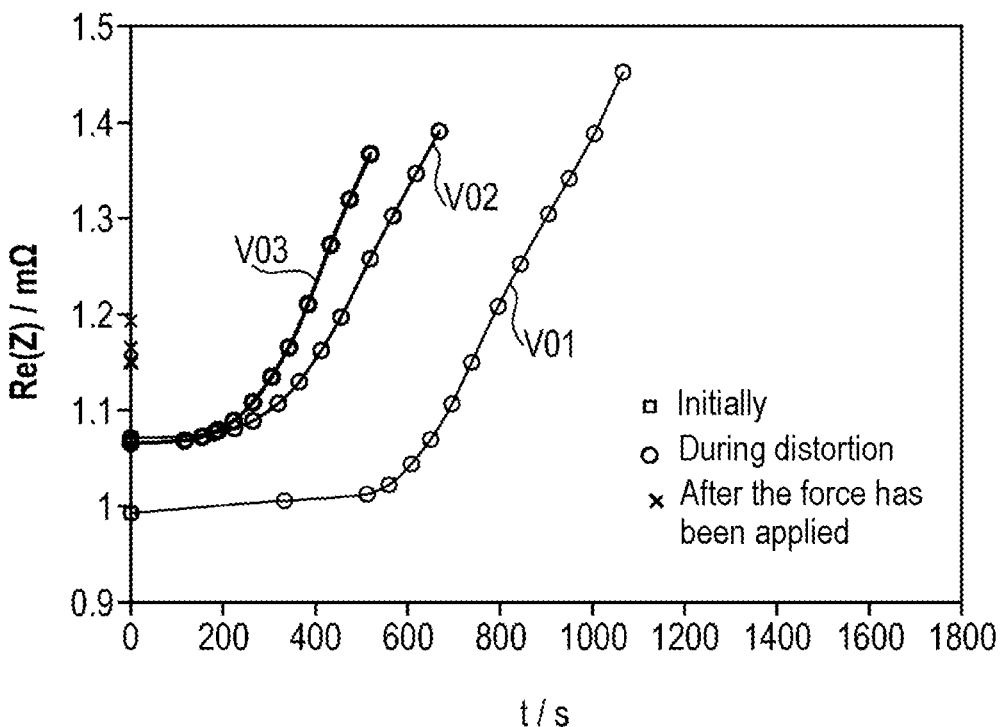
FIGS. 3A and 3B are diagrams showing curves of the real part of the measured impedance of the energy storage cells and the corresponding change over time, the curves corresponding to the three test series when a force is applied from direction a).
Figure 3B:
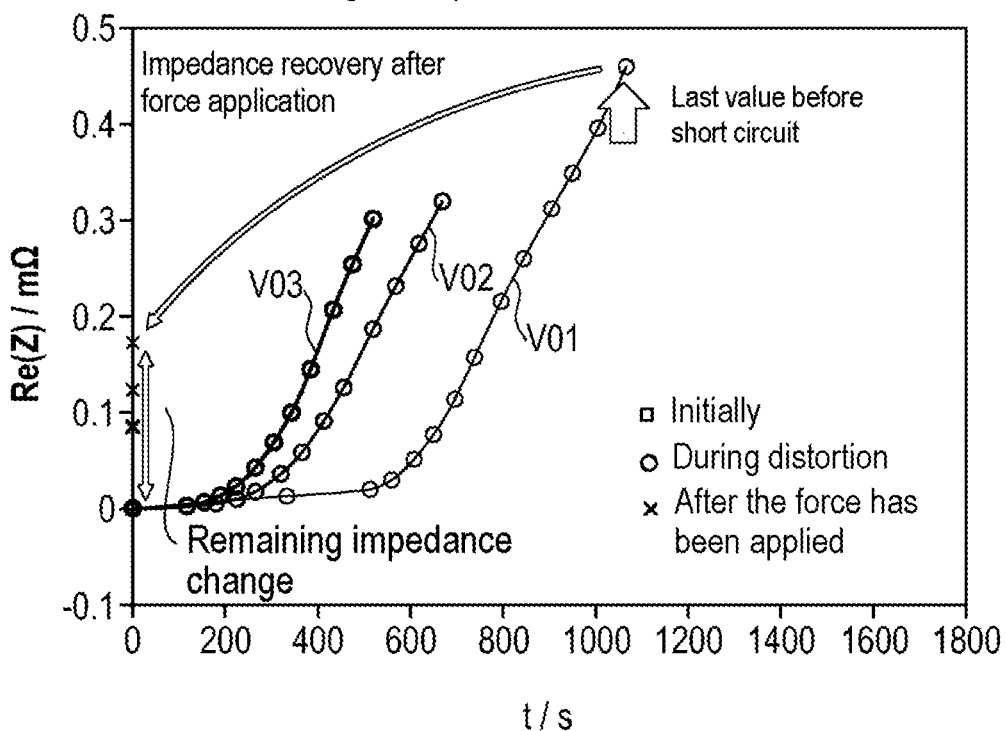

FIG. 3A shows the real part of the impedance for each of the test series V01 to V03 when a force is applied from direction a). In the test series V01, the real part of the impedance before the application of force is approximately 1.0 mΩ (unit: milliohm) and in the test series V02 and V03 approximately 1.08 mΩ. During the application of force and deformation of the individual energy storage cells, the real part of the impedance rises sharply in each of the test series V01-V03.

After the end of the respective application of force, the real parts of the individual impedances recover again. For example, in the test series V01 the real part goes back to about 1.108 mΩ. In the remaining test series V02 and V03 the situation is similar.

At this point it can be stated that a deformation of the corresponding energy storage cell leads to a significant increase or change in the real part of the corresponding impedance. For example, the total change in impedance in the test series V01 is approximately 0.18 mΩ. In the other test series V02, V03 the change is smaller, but also quite easily measurable (in the test series V02 the total change is approx. 0.103 mΩ, in the test series V03 approx. 0.09 mΩ).

Figure 3C:
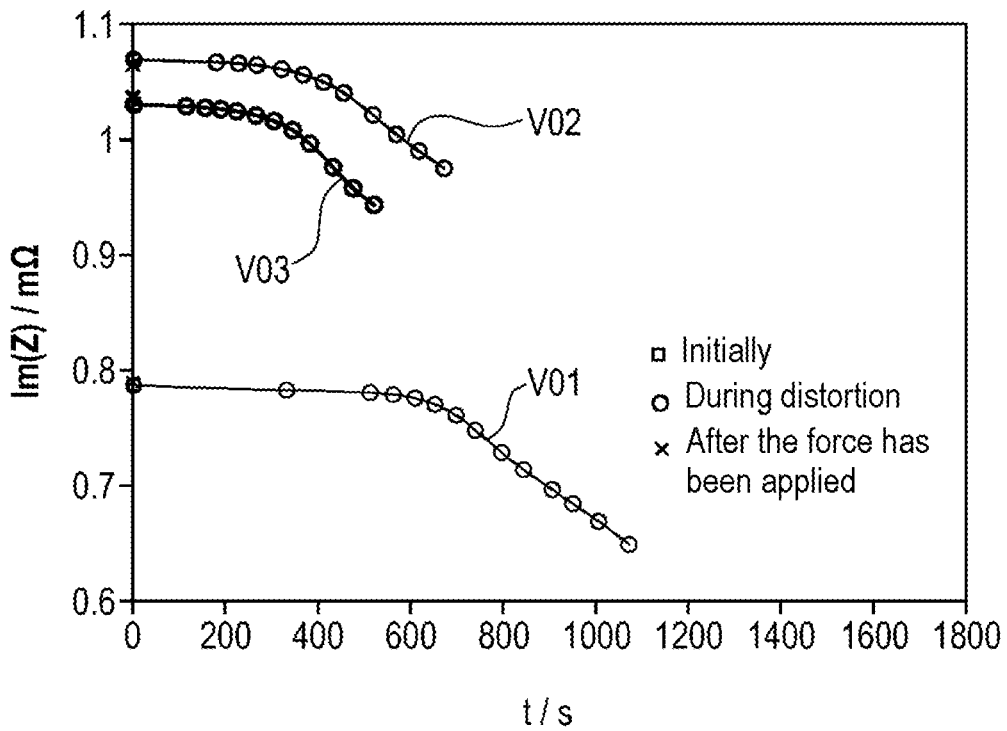

FIGS. 3C and 3D show corresponding results of the imaginary part of the impedance obtained during the impedance spectroscopy performed. FIG. 3C shows the absolute value of the imaginary part of the impedance and FIG. 3D shows the corresponding change.

As can be seen in FIGS. 3C and 3D, the imaginary part of the impedance drops sharply during deformation/distortion. In the test series V01, for example, the imaginary part of the impedance is reduced by about 0.14 mΩ. The change in the imaginary part in the remaining test series V02/V03 is accordingly similar to the lower force applications.

However, a significant difference between the change in the real part and the imaginary part is that a significant change in the real part remains after the end of the force application, whereas the imaginary part returns to approximately its original value.

This behavior is beneficial in that it makes it possible to distinguish the deformation/distortion of the energy storage cells from other influences.

The impedance, that is, the real part and the imaginary part, is strongly temperature dependent. If the temperature of the energy storage cell 1 rises, both the real part and imaginary part of the impedance change. However, the corresponding change is uniform. If, as a result, it is found during impedance spectroscopy that the real part and imaginary part of the impedance change uniformly, it must be concluded that the change is not due to a deformation of the energy storage cell 1, but to a corresponding heating of the energy storage cell 1.

Finally, FIG. 4 shows the effects of the deformation of the energy storage cells in the test series V01 to V03 when force is applied from direction a) in relation to the voltage of the respective energy storage cells and their temperature.

In the upper diagram of FIG. 4 it is clearly visible that a slight short circuit occurs in the energy storage cell 1 only in the test series V01, whereas in the remaining test series V02 and V03 the voltage of the corresponding energy storage cell remains approximately constant.

The lower diagram in FIG. 4 also confirms the voltage behavior accordingly. In the test series V01, the slight short circuit of the energy storage cell causes the corresponding temperature to rise by about 2° C. In the remaining test series V02, V03 the temperature remains approximately constant according to the voltage curves.

The findings of the invention can be applied very well to automotive applications, in particular to partially electrically powered vehicles (hybrid vehicles) or completely electrically powered vehicles. In this case, the motor vehicles shall be equipped with a device for detecting a deformation of the electrical energy storage device of the motor vehicle. The device includes a measuring device arranged to measure an electrical impedance of the energy storage device. The measuring device performs the impedance spectroscopy explained above. Here, the energy storage device of the motor vehicle, which is made up of a large number of the described energy storage cells 1, is excited with an AC voltage and its impedance is determined from the reaction of the energy storage device. An additional sensor system to be attached to the energy storage device is not necessary for this purpose.

In addition, the aforementioned device includes an evaluation unit which is arranged to detect a change in impedance and to determine the deformation based on the change.

In particular, the impedance measuring device is arranged to determine a real part and an imaginary part of the electrical impedance, and the evaluation unit is arranged to determine the change in impedance by comparing a change in the real part with a change in the imaginary part. If the changes are uniform, the evaluation unit decides that there is no deformation, but that the energy storage device has only warmed up.

If, on the other hand, the evaluation unit recognizes that the real part and the imaginary part have changed differently, the evaluation unit determines the deformation/distortion of the energy storage device and output a corresponding signal to disconnect the energy storage device or takes over this function itself.

For the implementation of these functions of the evaluation unit, it is not absolutely necessary to determine the multitude of measured values explained in the previous section. If an accident occurs, the duration of the deformation is also shorter compared to the test series V01 to V03. In principle, a single measured value of the real part of the impedance and a single measured value of the imaginary part of the impedance, for example after the deformation has ended, are sufficient. Preferably, however, a large number of respective measured values can also be obtained.

FIG. 1B shows that the change in the impedance of the energy storage device behaves differently depending on the direction from which the force is applied to the energy storage device. The evaluation unit is preferably arranged to determine the deformation when the change in impedance exceeds a certain threshold value. For example, the threshold value can be defined in relation to the real part of the impedance and is preferably designed to detect a deformation regardless of the direction from which the force is applied.

The impedance measuring device can measure the impedance preferably when it receives a trigger signal. For example, such a trigger signal is output by a control unit when the vehicle is activated or by a collision or accident sensor.

Alternatively to the impedance, the corresponding admittance can also be measured and used for the individual functions.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A device for detecting a deformation of an electrical energy storage device, the device comprising:
   a measuring device that measures an electrical impedance or an electrical admittance of the energy storage device, and determines a real part and an imaginary part of the electrical impedance or the electrical admittance; and
   an evaluation unit that determines a change in the electrical impedance or the electrical admittance by comparing a change in the real part with a change in the imaginary part, and determines the deformation based on the change.

2. The device according to claim 1, wherein
   the evaluation unit determines the deformation if the comparison between the real part and the imaginary part shows that the change in the real part and the change in the imaginary part are not uniform with each other.

3. The device according to claim 2, wherein
   the evaluation unit determines the deformation when the change in the electrical impedance or the electrical admittance exceeds a certain threshold value.

4. The device according to claim 1, wherein
   the evaluation unit receives or determines a temperature value indicating a temperature in an environment of the energy storage device and relates the temperature value to the change in the electrical impedance or the electrical admittance.

5. The device according to claim 1, wherein
   the measuring device measures the electrical impedance or the electrical admittance of the electrical energy storage device by performing impedance spectroscopy or admittance spectroscopy on the energy storage device.

6. The device according to claim 1, wherein
   the evaluation unit determines the change when a trigger signal is received.

7. A motor vehicle, comprising:
   a device for detecting a deformation of an electrical energy storage device, the device comprising:
      a measuring device that measures an electrical impedance or an electrical admittance of the energy storage device, and determines a real part and an imaginary part of the electrical impedance or the electrical admittance;
      an evaluation unit that determines a change in the electrical impedance or the electrical admittance by comparing a change in the real part with a change in the imaginary part, and determines the deformation based on the change; and
   at least one of a collision sensor arranged to detect a collision of the motor vehicle with an obstacle, or a control unit, wherein
   the evaluation unit is configured to determine the change upon receiving a trigger signal output by the collision sensor upon detection of the collision or by the control unit upon activation of the motor vehicle.

* * * * *